United States Patent [19]

Geiger et al.

[11] Patent Number: 5,453,721
[45] Date of Patent: Sep. 26, 1995

[54] ATTENUATOR

[75] Inventors: Scott R. Geiger, Ingleside; Mark G. Obermann, Niles, both of Ill.

[73] Assignee: Motorola, Inc., Schaumburg, Ill.

[21] Appl. No.: 257,603

[22] Filed: Jun. 9, 1994

[51] Int. Cl.⁶ .................................................. H03H 7/24
[52] U.S. Cl. ........................................ 333/81 R; 333/81 A
[58] Field of Search ............................... 333/170, 171, 333/81 R, 81 A

[56] References Cited

FOREIGN PATENT DOCUMENTS

| 160201 | 8/1985 | Japan | 333/81 A |
|---|---|---|---|
| 139110 | 6/1986 | Japan | 333/81 R |
| 915138 | 3/1982 | U.S.S.R. | 333/81 R |
| 841560 | 7/1960 | United Kingdom | 333/170 |

Primary Examiner—Paul Gensler
Attorney, Agent, or Firm—Raymond J. Warren; Daniel C. Crilly

[57] ABSTRACT

An electrical circuit (200) having an input terminal (201), an output terminal (202), and a signal common (203) is preferably used to attenuate an electrical signal. The electrical circuit (200) comprises four impedance elements (205–208) and an impedance transformer (210). A first impedance element (205) is coupled between the input terminal (201) and a first node (212), while a second impedance element (206) is coupled between the first node (212) and the output terminal (202). A third impedance element (207) is coupled between the input terminal (201) and the output terminal (202), while a fourth impedance element (208) is coupled between a second node (213) and the signal common (203). The impedance transformer (210) is coupled between the first node (212) and the second node (213) to complete the electrical circuit (200).

3 Claims, 1 Drawing Sheet

— PRIOR ART —

ATTENUATOR

FIELD OF THE INVENTION

The present invention relates generally to attenuators and, in particular, to a constant impedance variable attenuator.

BACKGROUND OF THE INVENTION

Electrical circuits that attenuate electrical signals are known as attenuators. Such attenuators are commonly used to control the gain of radio frequency amplifier stages. For example, a high power amplifier typically consists of a plurality of lower power amplifier stages arranged in a parallel configuration. The output of each amplifier stage is combined with the other amplifier stage outputs in a combiner to produce a desired output power. To minimize combining losses in the combiner, each amplifier stage needs to provide approximately equal gain. Thus, variable attenuators are often positioned at the input to each amplifier stage to control the stage's gain in light of inevitable component tolerances. In addition, the variable attenuators typically maintain constant input and output impedances (e.g., 50 ohms) to minimize their loading effect on the amplifier stages' input impedances.

One such prior art constant impedance attenuator 100 is schematically depicted in FIG. 1. This attenuator 100 is commonly known as a bridged-T attenuator. The bridged-T attenuator 100 has an input terminal 101, an output terminal 102, and a signal common 103 and attenuates an electrical signal incident at the input terminal 101. The attenuator 100 comprises four resistors 105–108. Resistor 105 is connected between the input terminal 101 and node 110, while resistor 106 is connected between node 110 and the output terminal 102. Resistor 107 is connected between the input terminal 101 and the output terminal 102, while resistor 108 is connected between node 110 and the signal common 103. Resistors 105, 106 have equal resistances, while resistors 107, 108 have inversely proportional resistances to maintain the attenuator's constant input and output impedances. Resistors 107, 108 are typically variable resistors that provide attenuation adjustment to the attenuator 100.

To adjust the attenuation of the attenuator 100 to a particular level while maintaining the attenuator's constant input and output impedances, the resistance of resistor 108 must be varied inversely with respect to the resistance of resistor 107. Therefore, if the resistance of resistor 107 is increased to a desired level, the resistance of resistor 108 must be correspondingly decreased to an inversely proportional level, and vice versa. Thus, at least one of the variable resistors 107, 108 of the bridged-T attenuator 100 must be capable of having its resistance decreased in order to maintain the constant input and output impedances.

Amplifier stages in high power amplifiers are typically fabricated on alumina ceramic substrates to facilitate heat transfer of heat generated by the amplifier stages to a heat sink. When an amplifier stage is constructed on ceramic, the resistors used in the amplifier stages are commonly fabricated as thick film resistors deposited on the substrate using well-known thick film fabrication techniques. In addition, an amplifier stage necessitating a variable attenuator typically incorporates the variable attenuator on the ceramic substrate containing the amplifier stage to permit adjustment, or tuning, of the attenuator's variable resistors during the tuning of any variable elements of the amplifier stage (e.g., distributed capacitors and resistors). However, thick film resistors can only have their resistances increased during tuning (e.g., with a laser). Thus, the use of thick film resistors in a bridged-T attenuator 100 is restricted due to the requirement that the branch resistance between node 110 and the signal common 103 decrease when the resistance of resistor 107 increases.

Therefore, a need exists for an electrical circuit that facilitates the use of thick film resistors as the variable elements of a constant impedance variable attenuator.

DESCRIPTION OF A PREFERRED EMBODIMENT

Generally, the present invention provides an electrical circuit having an input terminal, an output terminal, and a signal common that is preferably used to attenuate an electrical signal. The electrical circuit comprises four impedance elements and an impedance transformer. A first impedance element is coupled between the input terminal and a first node, while a second impedance element is coupled between the first node and the output terminal. A third impedance element is coupled between the input terminal and the output terminal, while a fourth impedance element is coupled between a second node and the signal common. The impedance transformer is coupled between the first node and the second node to complete the electrical circuit. By constructing an electrical circuit in this manner, the present invention provides a circuit topology in which the variable elements of a variable attenuator can be increased to obtain a desired attenuation, as opposed to requiring one variable element to be increased while another variable element is decreased as in the prior art.

Figure 2:
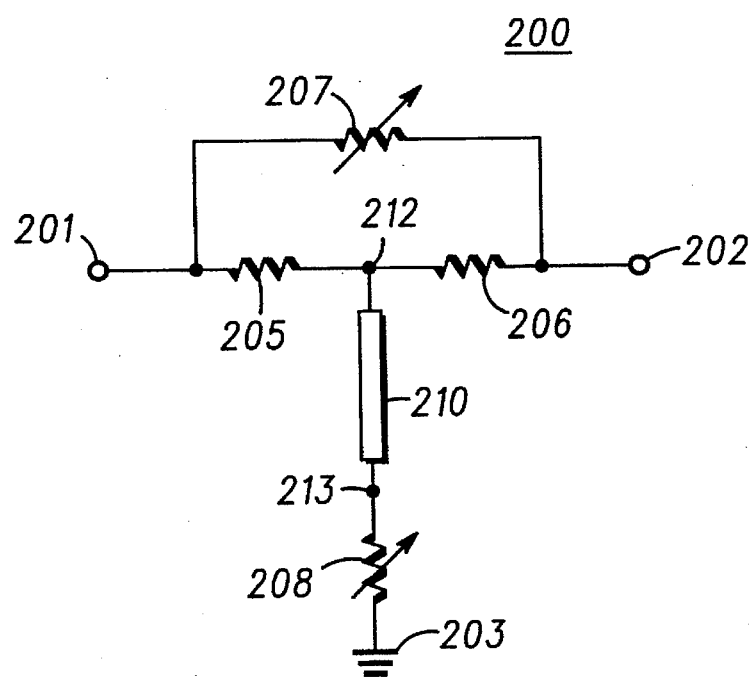
FIG. 2 illustrates a schematic diagram of an attenuator in accordance with a preferred embodiment of the present invention.

The present invention can be more fully described with reference to FIG. 2. FIG. 2 illustrates a schematic diagram of an attenuator 200 having an input terminal 201, an output terminal 202, and a signal common 203 in accordance with a preferred embodiment of the present invention. The attenuator 200 comprises four impedance elements and an impedance transformer. In the preferred embodiment, the four impedance elements comprise resistive elements 205–208, although other impedance elements, such as inductors or capacitors, might be alternatively employed. The impedance transformer preferably comprises a transmission line 210 having an electrical length of approximately one-quarter wavelength of an operating frequency of the attenuator 200. However, in an alternate embodiment, the impedance transformer might comprise discrete components, such as inductors and capacitors or a discrete transformer. As shown, resistive element 205 is coupled between the input terminal 201 and node 212, while resistive element 206 is coupled between node 212 and the output terminal 202. Resistive element 207 is coupled between the input terminal 201 and the output terminal 202, while resistive element 208 is coupled between node 213 and the signal common 203 (e.g., ground). The transmission line is coupled between node 212 and node 213 to form, in combination with resistive element 208, an effective branch resistance between node 212 and the signal common 203.

In the preferred embodiment, the attenuator 200 is fabricated on a substrate (not shown), such as alumina ceramic, and the resistive elements 205–208 comprise thick film resistors disposed on the substrate. The transmission line 210 preferably comprises a microstrip transmission line disposed on the substrate. The resistive elements 205–208 and the transmission line 210 are fabricated using well-known ceramic printed circuit board techniques.

The resistive elements 205–208 are preferably constructed such that resistive elements 205, 206 have substantially equal resistances (e.g., within 5% of each other), while resistive elements 207, 208 have substantially equal resistances that are preferably unique from the nominal resistances of resistive elements 205, 206. The transmission line is preferably constructed with a characteristic impedance substantially equal to the nominal resistance of resistive elements 205, 206. Such a construction of the resistive elements 205–208 and the transmission line 210 allows the attenuator 200 to maintain constant input and output impedances. For example, to provide a 50 ohm input impedance between the input terminal 201 and the signal common 203 and a 50 ohm output impedance between the output terminal 202 and the signal common 203, the resistances of resistive elements 205, 206 and the characteristic impedance of the transmission line 210 are nominally 50 ohms, while the resistances of resistive elements 207, 208 depend on a desired attenuation of the attenuator 200 (e.g., an attenuation of approximately 4 db can be realized when the resistances of resistors 207, 208 are nominally 29 ohms).

Figure 1:
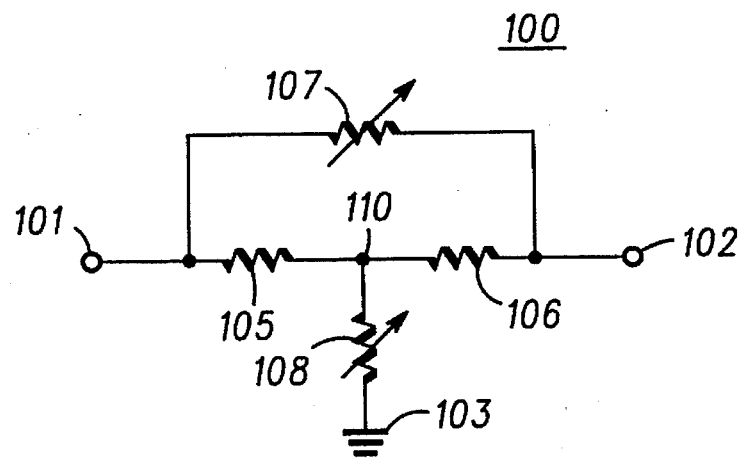
FIG. 1 illustrates a schematic diagram of a typical prior art attenuator circuit.

Similar to the prior art attenuator 100 discussed above with regard to FIG. 1, the preferred attenuator 200 attenuates an electrical signal incident at the input terminal 201. The amount of attenuation is selected by varying resistive elements 207, 208. However, in contrast to the circuit 100 of FIG. 1, the present invention facilitates adjustment of the variable resistive elements 207, 208 in an increasing direction only to obtain the desired amount of attenuation. In the preferred embodiment, the transmission line 210 transforms the resistance of resistive element 208, such that the effective branch resistance present between node 212 and the signal common 203 decreases as the resistance of resistive element 208 is increased. Thus, the present invention permits the use of tunable thick film resistors as the variable resistive elements 207, 208 since both variable resistive elements 207, 208 can be increased to achieve a desired attenuation level. Therefore, the preferred embodiment of the present invention provides the benefits of variable attenuation and constant input and output impedances as in the well-known bridged-T attenuator circuit 100, without requiring variable resistive element 208 to be adjusted inversely in value with respect to variable resistive element 207 in order to obtain such benefits.

The present invention provides an electrical circuit having an input terminal, an output terminal, and a signal common that is preferably used to attenuate an electrical signal. With this invention, thick film resistors can be incorporated as the variable elements in a constant impedance variable attenuator even though they can only have their resistances adjusted in an increasing direction. Further, by allowing the use of thick film resistors, the present invention facilitates automated adjustment of an attenuator's variable components via precision adjustment apparatuses, such as lasers.

What is claimed is:

1. An attenuator having an input terminal, an output terminal, and a signal common that attenuates an electrical signal incident at the input terminal, comprising:

a first resistive element, coupled between the input terminal and a first node, having a first resistance;

a second resistive element, coupled between the first node and the output terminal, having a resistance substantially equal to the first resistance;

a first thick film resistive element, coupled between the input terminal and the output terminal, having a second resistance;

a transmission line, coupled between the first node and a second node, having a characteristic impedance substantially equal to the first resistance; and a second thick film resistive element, coupled between the second node and the signal common, having a resistance substantially equal to the second resistance.

2. The attenuator of claim 1, wherein the transmission line has an electrical length of approximately one-quarter wavelength of an operating frequency of the attenuator.

3. An attenuator having an input terminal, an output terminal, and a signal common that attenuates an electrical signal incident at the input terminal, comprising:

a first resistive element, coupled between the input terminal and a first node, having a first resistance;

a second resistive element, coupled between the first node and the output terminal, having a resistance substantially equal to the first resistance;

a first thick film resistor, coupled between the input terminal and the output terminal, having a second resistance;

a second thick film resistor, coupled between a second node and the signal common, having a resistance substantially equal to the second resistance; and a transmission line, coupled between the first node and the second node, having a characteristic impedance substantially equal to the first resistance and an electrical length of approximately one-quarter wavelength of an operating frequency of the attenuator, that transforms the resistance of the second thick film resistor, such that an increase in the resistance of the second thick film resistor effectively decreases a branch resistance between the first node and the signal common.

* * * * *